United States Patent
Gengel (10) Patent No.: US 6,566,744 B2
(45) Date of Patent: May 20, 2003

(54) INTEGRATED CIRCUIT PACKAGES ASSEMBLED UTILIZING FLUIDIC SELF-ASSEMBLY

(75) Inventor: Glenn Wilhelm Gengel, Berthroud, CO (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 10/177,045

(22) Filed: Jun. 21, 2002

(65) Prior Publication Data

US 2002/0153606 A1 Oct. 24, 2002

Related U.S. Application Data

(62) Division of application No. 09/825,381, filed on Apr. 2, 2001, now Pat. No. 6,417,025.

(51) Int. Cl.[7] .............................................. H01L 23/02
(52) U.S. Cl. ...................... 257/678; 257/730; 257/690; 257/700; 257/737; 257/779; 257/734
(58) Field of Search .................................. 257/678, 730, 257/690, 700, 737, 779, 734

(56) References Cited

U.S. PATENT DOCUMENTS

| | | | |
|---|---|---|---|
| 5,188,984 A | * | 2/1993 | Nishiguchi .................. 437/211 |
| 5,545,291 A | * | 8/1996 | Smith et al. .............. 156/655.1 |
| 6,309,912 B1 | * | 10/2001 | Chiou et al. ................ 438/118 |

* cited by examiner

Primary Examiner—David L. Talbott
Assistant Examiner—David A. Zarneke
(74) Attorney, Agent, or Firm—Blakely, Sokoloff, Taylor & Zafman LLP (57) ABSTRACT

Assembly of integrated circuit packages, such as BGA packaged devices, using fluidic self-assembly. Functional components, such as integrated circuits, having a wired side are suspended in a fluid and flowed over a substrate. The substrate has a top first dielectric layer and recessed receptor regions for receiving the functional components. The functional components are deposited in the receptor regions using fluidic self-assembly such that the wired side is facing outward from the receptor region. A conductive layer is then formed on the first dielectric layer to form conductive interconnects to the functional components. A second dielectric layer is then formed on the conductive layer. The second dielectric layer has openings for receiving conductive elements. Conductive elements, such as solder balls, are deposited into the openings in the second dielectric layer and contact the conductive layer.

24 Claims, 11 Drawing Sheets

INTEGRATED CIRCUIT PACKAGES ASSEMBLED UTILIZING FLUIDIC SELF-ASSEMBLY

This application is a divisional application of U.S. patent application Ser. No. 09/825,381, filed Apr. 2, 2001, U.S. Pat. No. 6,417,025.

BACKGROUND OF THE INVENTION

1. Field of the Invention

The present invention relates generally to integrated circuits. In particular, the present invention relates to methods for forming integrated circuit packages.

2. Description of Related Art

Integrated circuit (IC) devices used in the semiconductor industry are frequently packaged prior to use in larger electronic systems, such as computers. The packaging is used to protect the small integrated circuit devices and to provide electrical connections to the contacts of the integrated circuits.

Ball grid array (BGA) packaging of integrated circuit devices is one method currently used to package integrated circuit devices in the semiconductor industry. BGA packaging has allowed integrated circuit packages to fit into smaller footprint regions to allow for a higher density of connections than earlier packaging methods, such as pin grid arrays. Typically, a ball grid array package is designed in a "fan-in" pattern in which solder ball connections are located directly above an integrated circuit and allow for electrical interconnection to the packaged integrated circuit device.

FIGS. 1A through 1D illustrate cross-sectional views of one example of a method for forming a BGA integrated circuit package in the prior art.

Figure 1A:
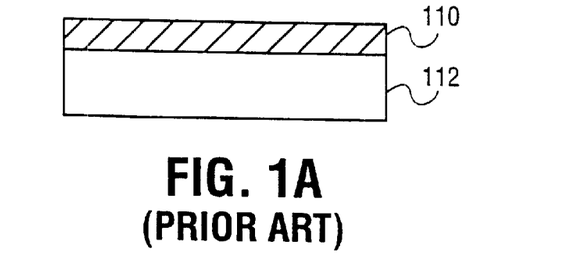
FIGS. 1A through 1D illustrate cross-sectional views of one example of a method for forming BGA integrated circuit package in the prior art.

In FIG. 1A, a conductive wiring layer 110 is applied to an entire integrated circuit wafer 112. The integrated circuit wafer 112 typically includes a plurality of individual integrated circuit devices, and the wiring layer 110 forms interconnections to the individual integrated circuit devices on the wafer 112.

Figure 1B:
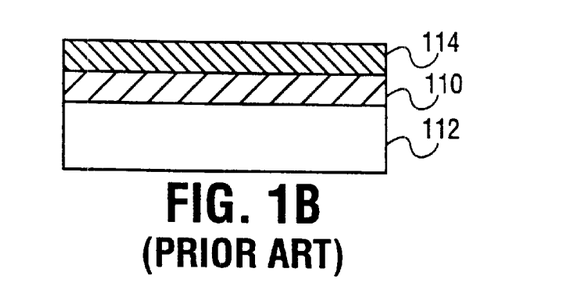

In FIG. 1B, a dielectric layer 114, such as a layer of $SiO_2$ is then formed over the wiring layer 110.

Figure 1C:
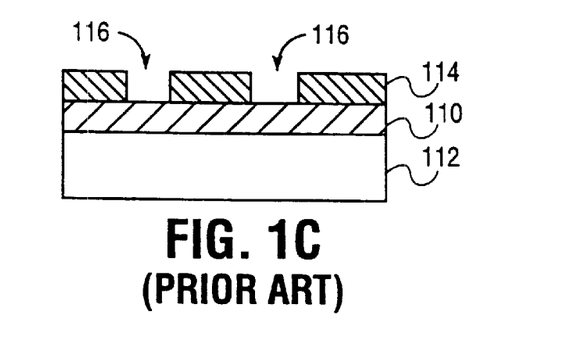

In FIG. 1C, openings 116 are then formed in the dielectric layer 114 for receiving solder balls. Typically, the openings 116 are formed over the integrated circuit devices.

Figure 1D:
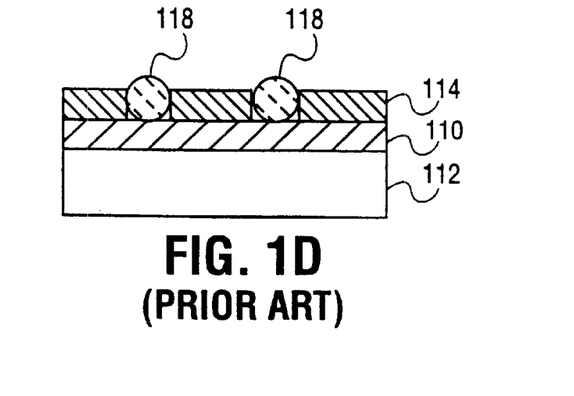

In FIG. 1D, the integrated circuit wafer 112 is then cut into individual packaged integrated circuit dies and solder balls 118 are deposited into the openings and reflowed to form the solder ball connections to the wiring layer 110. The resulting integrated circuit packages have a fan-in arrangement of the solder ball connections over the integrated circuit device. Frequently, the integrated circuit packages are then attached to other components, such as a printed circuit board having a heat sink that provides heat dissipation for the packaged integrated circuit device.

Figure 2:
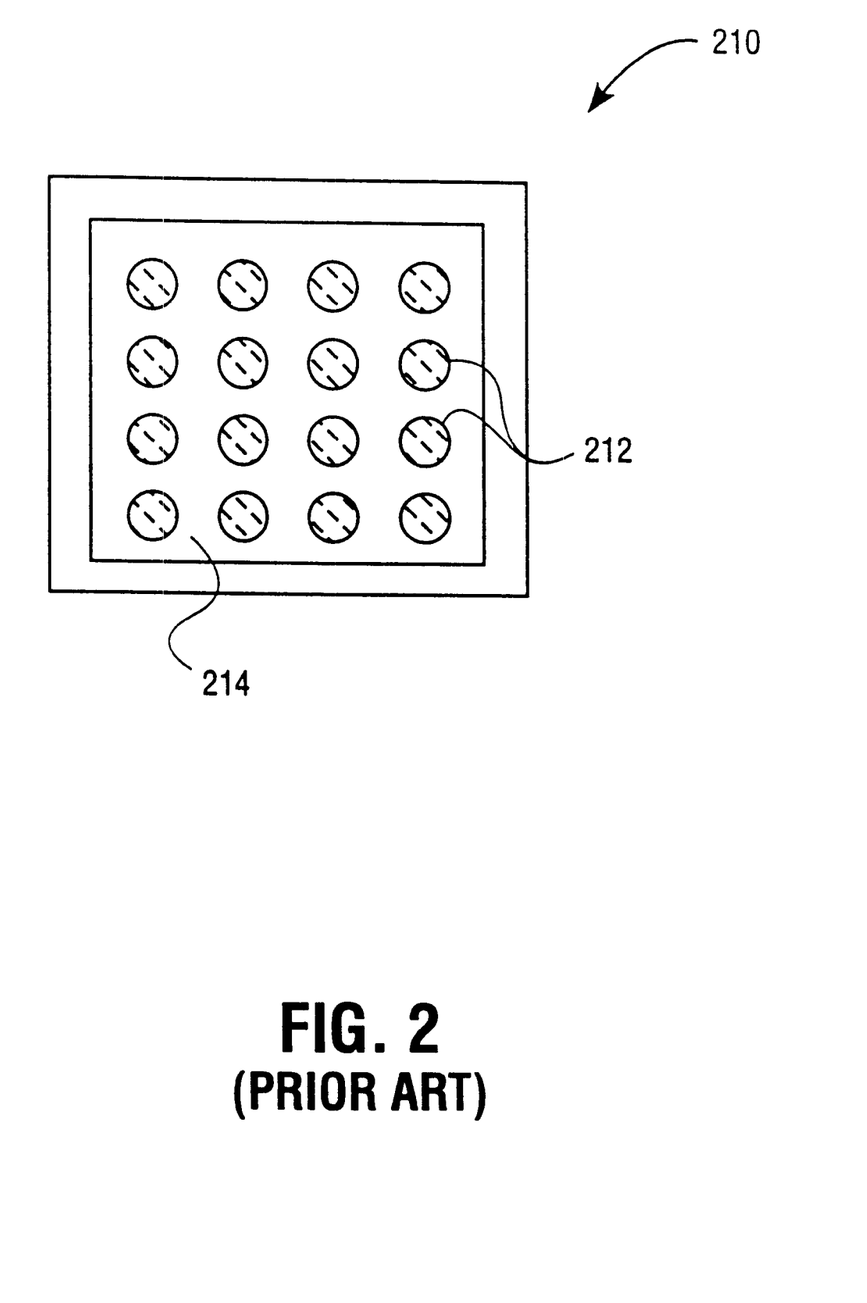
FIG. 2 illustrate top view of one example of a fan-in pattern of a BGA packaged integrated circuit device in the prior art.

FIG. 2 illustrates a top view of one example of a fan-in pattern of a BGA packaged integrated circuit device in the prior art. In the illustration, the integrated circuit package 210 has solder connections 212 located above the integrated circuit device 214.

BRIEF SUMMARY OF THE INVENTION

The present invention includes methods for forming integrated circuit packages, such as BGA packaged integrated circuit packages, using fluidic self-assembly, and apparatuses formed thereby. According to one embodiment of the present invention, functional components, such as electronic integrated circuit components, having a wired side are suspended in a fluid and flowed over a substrate. The substrate has a top layer of a first dielectric and has recessed receptor regions for receiving the functional components. The functional components are deposited in the receptor regions using fluidic self-assembly such that the wired side is facing outward from the receptor region. A conductive layer, such as a wiring layer, is then formed on the first dielectric forming conductive interconnects to the wired side of the functional component. A second dielectric layer is then fabricated on top of the conductive layer. The second dielectric layer has openings for receiving conductive elements. Conductive elements, such as solder balls, are deposited into the openings in the second dielectric layer and contact the conductive layer. The substrate may then be separated into individual integrated circuit packages.

BRIEF DESCRIPTION OF THE DRAWINGS

FIGS. 4A–4O illustrate cross-sectional views of one embodiment of a method for forming integrated circuit device packages using fluidic self-assembly according to the present invention.

DETAILED DESCRIPTION OF THE INVENTION

The present invention includes methods for forming integrated circuit packages, such as BGA packaged devices, using fluidic self-assembly, and apparatuses formed thereby.

In the following description, specific details are set forth in order to provide a thorough understanding of the present invention. Well known integrated circuit package manufacturing processes, such as vapor deposition, wet and dry etching, curing, singulation, and other such conventional integrated circuit manufacturing processes will not be described in detail in order not to unnecessarily obscure the present invention.

In one embodiment, functional components having a wired side are suspended in a fluid and flowed over a substrate. The substrate has a top first dielectric layer and has recessed receptor regions for receiving the functional components, such as integrated circuits. The functional components are deposited in the receptor regions using fluidic self-assembly such that the wired side of the functional component is facing outward from the receptor region. A conductive layer, such as a wiring layer, is then formed on the first dielectric layer. The conductive layer is formed such that conductive interconnects are formed to the functional components. A second dielectric layer is then fabricated on top of the conductive layer. The second dielectric layer has openings for receiving conductive elements. Conductive elements, for example, solder balls, are deposited into the openings in the second dielectric layer and contact the conductive layer, e.g., the wiring layer. The substrate may then be separated into individual integrated circuit packages.

Figure 3:
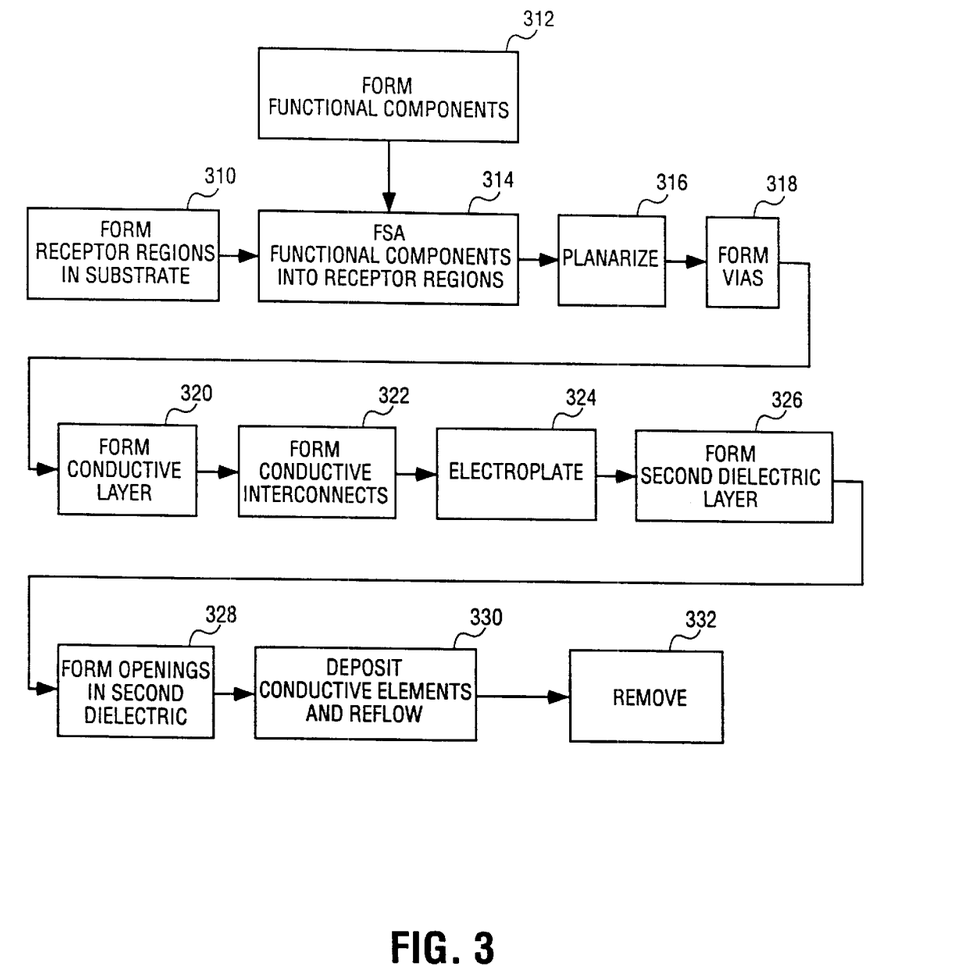
FIG. 3 illustrates a general flow diagram of one embodiment of a method of forming an integrated circuit package using FSA according to one embodiment of the present invention.

FIG. 3 illustrates a general flow diagram of one embodiment of a method of forming an integrated circuit package using FSA according to one embodiment of the present invention.

At block 310, a substrate material having a top first dielectric layer is obtained and receptor regions are formed in the substrate. This process is further described herein with reference to FIGS. 4A and 4B.

At block 312, functional components are formed or obtained for assembly into the receptor regions of the substrate. In one embodiment, the functional components may be low-lead count integrated circuit devices such as op amps, 74XX series logic devices, etc., fabricated on self-assembling microstructures, such as shaped nanoblocks. The functional components are further described herein with reference to FIG. 4C.

At block 314, the functional components are self-assembled into the receptor regions using fluidic self-assembly. This process is further described herein with reference to FIG. 4C.

At block 316, the functional components are planarized into the substrate. This process is further described herein with reference to FIG. 4D.

At block 318, interconnect vias are formed in the planarization layer. This process is further described herein with reference to FIGS. 4E and 4F.

At block 320, a conductive layer, such as a wiring layer, is formed. This process is further described herein with reference to FIG. 4G.

At block 322, the conductive layer is patterned to form conductive interconnects, i.e., wiring, to the functional components. This process is further described herein with reference to FIGS. 4H through 4J.

At block 324, the conductive layer is electroplated to build up the connection. This process is further described herein with reference to FIG. 4J.

At block 326, a second dielectric layer is formed. This process is further described herein with reference to FIG. 4K.

At block 328, openings are formed in the second dielectric layer outside the footprint of the functional component. This process is further described herein with reference to FIGS. 4L and 4M.

At block 330, conductive elements, such as solder balls, are deposited in the openings, and reflowed to form electrical interconnections to the functional components. This process is further described herein with reference to FIGS. 4N and 4O.

At block 332, the integrated circuit packages may be removed from the substrate for use in other components or packaged for storage. For example, the integrated circuit packages may be die cut, cut with a laser, or cut with a roll die.

Figure 4A:
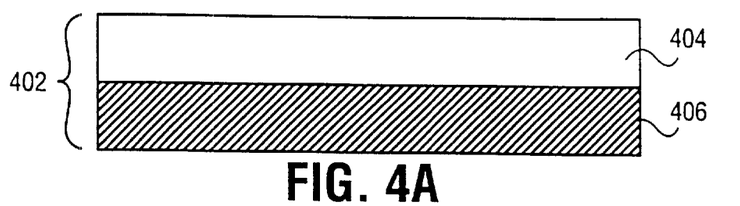

FIGS. 4A–4O illustrate cross-sectional views of one embodiment of a method for forming integrated circuit device packages using fluidic self-assembly according to the present invention.

In FIG. 4A a substrate is obtained on which to form a patterned web of recessed receptor regions. The substrate 402 may be a dual layer substrate formed of a top first dielectric layer 404 on a thermally conductive layer 406. The top first dielectric layer 404 may be silicon dioxide and the thermally conductive layer 406 may be aluminum. The first dielectric layer 404 is about 50 microns thick and the thermally conductive layer 406 is about 50 microns thick. In other embodiments, the thickness of the first dielectric layer 404 and the thermally conductive layer 406 may be within a range between and including 25 to 100 microns each.

It will be appreciated that the top first dielectric layer 404 may also be formed from other materials, such as polymers, i.e., polyethersulfone (PES), polysulfone (PS), etc. The thermally conductive layer 406 may be formed of other metals or metal alloys, such as copper, copper-beryllium alloys, molybdenum, nickel, INVAR, INCONEL, etc.

The substrate 402 may also be formed of a single layer material, such as PES, PS, green ceramic tape, etc., or may be multi-layered to accommodate different technical parameters of the integrated circuit package, such as voltage, flexibility, temperature, etc.

Figure 4B:
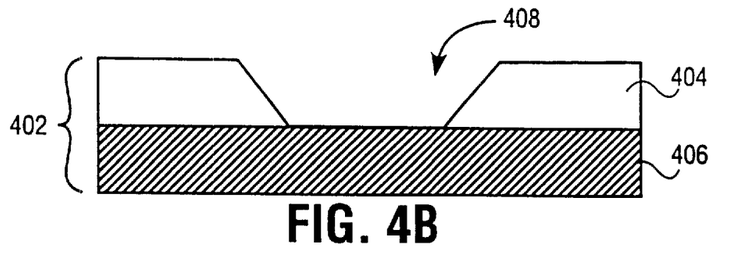

In FIG. 4B, the substrate 402 is recessed to form receptor regions 408 into which functional components will assemble through fluidic self-assembly (FSA). It will be appreciated that the receptor regions 408 may be spaced and arranged in a variety of patterns to accommodate a desired integrated circuit package design.

In one embodiment, the receptor regions 408 may be formed through the first dielectric layer 404 using a hot stamp process so that the thermally conductive layer 406 is exposed at the bottom of the receptor region 408. In other embodiments, the receptor regions 408 may be formed using a template punch, or laser, chemical or plasma etching, a cast, or impact extrusion. U.S. Pat. No. 5,545,291 describes formation of recessed regions in a substrate for use in FSA and is incorporated herein by reference.

The receptor regions 408 are formed so that the functional components assemble into the receptor regions 408 in a top up/bottom down orientation, i.e., the receptor regions 408 may be keyed. For example, the receptor regions 408 may be formed as trapezoidal shaped recesses.

Figure 4C:
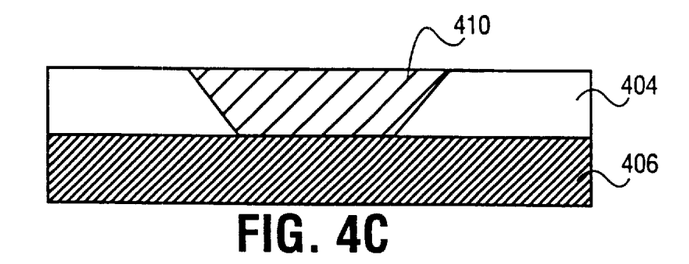

In FIG. 4C, functional components 410 are assembled into the receptor regions 408 using fluidic self-assembly. U.S. Pat. No. 5,545,291 describes assembly of microstructures, such as functional components, into a substrate utilizing FSA.

Generally, in FSA, a slurry containing a plurality of functional devices is flowed over the recessed substrate. The functional devices fall into the recesses in the substrate. Typically, the excess slurry is collected and recycled. The substrate is checked for empty recessed regions. For example, an electronic eye may view the substrate for empty regions. Functional devices may then be robotically placed into the empty regions.

In one embodiment, the functional components 410 may be low lead count devices, such as op-amps or 74XX series logic devices, however, it will be appreciated that other devices may also be utilized.

In one embodiment, the functional components 410 may be fabricated as trapezoidal-shaped nanoblocks that are narrower at the base end than at the top, where the wired side, e.g., the side having circuit leads, of the functional component resides at the top of the nanoblock. The blocks may for example be frustum-conical or frustum-pyramydal. Additionally, as earlier described with reference to FIG. 4B, the receptor regions 408 may also be trapezoidally shaped to receive the nanoblock in a top/bottom orientation so that the top wired side of the functional component 410 faces outward from the receptor region 408.

Formation of the functional component 410 such that the circuitry, e.g., the wired side, is at the top of the nanoblock allows for interconnections to be formed to the circuit leads. Also, this top/bottom orientation allows the bottom of the nanoblock to contact the exposed thermally conductive layer 406. This contact provides for heat dissipation from the functional component 410 to the thermally conductive layer 406. In this way, a separate heat sink for the integrated circuit package is not necessary as it is an intrinsic part of the substrate 402. This provides greater flexibility in designing pad limited components as heat dissipation is accomplished by the integrated circuit package, e.g., circuit board space previously needed for heat sinks may be utilized for other purposes. It will be appreciated that even in a single layer substrate 402, the choice of substrate material, may also provide heat dissipation, for example, ceramic substrates.

In other embodiments, the functional components 410 and/or receptor regions 408 may be designed differently, for example, keyed, so that the functional components 410 orient in the receptor regions 408 in one or more pre-determined orientations. This allows flexibility in designing particular interconnection patterns. For example, the trapezoidal shaped nanoblock and receptor region may be further shaped with one set of parallel sides longer than the other set of parallel sides to limit left/right orientations. In another example, the shaped nanoblock may be further shaped so that it may only orient in one way in the receptor region, e.g., all sides are different. It will be appreciated that the functional components 410 and/or receptor regions 408 may be differently keyed to achieve the same or different effects.

Figure 4D:
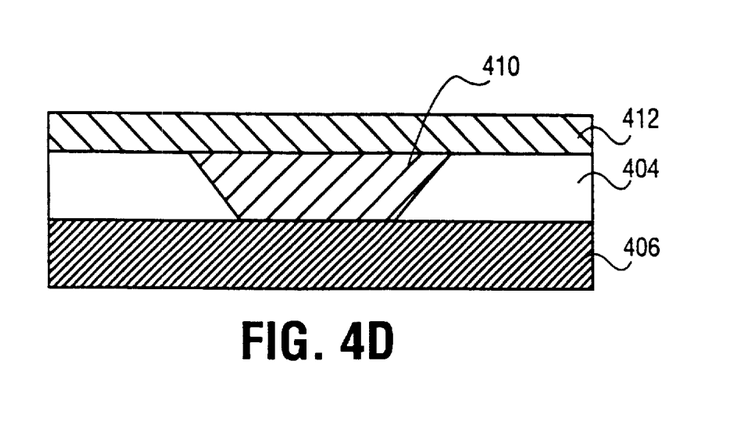

In FIG. 4D, the functional components 410 are planarized into the substrate. In one embodiment, the planarization may be accomplished by coating the surface of the substrate 402 including the assembled functional components 410 with a planarization layer 412, such as a photo polymer or a photoresist that is spun to flatten or lapped to flatten.

Figure 4E:
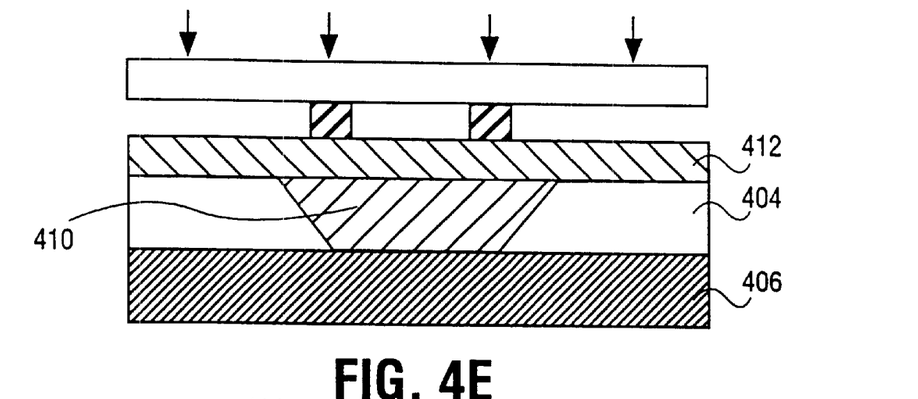
Figure 4F:
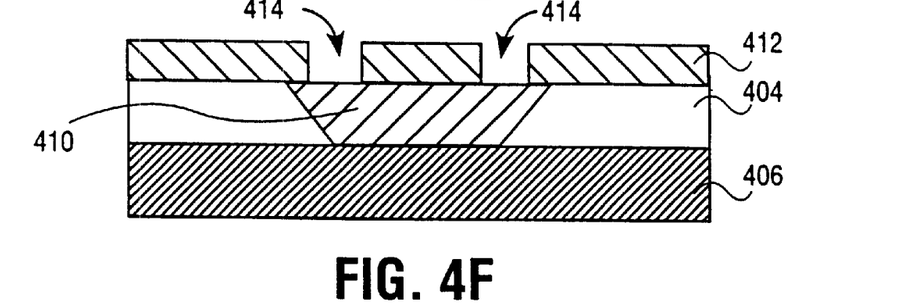

In FIG. 4E, the planarization layer 412 is patterned for the formation of interconnect vias and exposed to establish a circuit pattern. In one embodiment, the photo polymer may be a negative photoresist, such as epoxy methyacrelate. The photoresist is then exposed. In one embodiment, the exposure of the negative photoresist may be performed centered on the I-line. The exposed photoresist is developed, and the remaining photoresist is cured. In one embodiment, the photoresist may be cured in a batch oven at 150° C. for approximately one hour. In FIG. 4F, the pattern is developed to form the interconnect vias 414. It will be appreciated that other methods for the planarization and formation of the interconnect vias may also be utilized. For example, other embodiments of the present invention may utilize planarization methods described further herein with reference to FIG. 6.

Figure 4G:
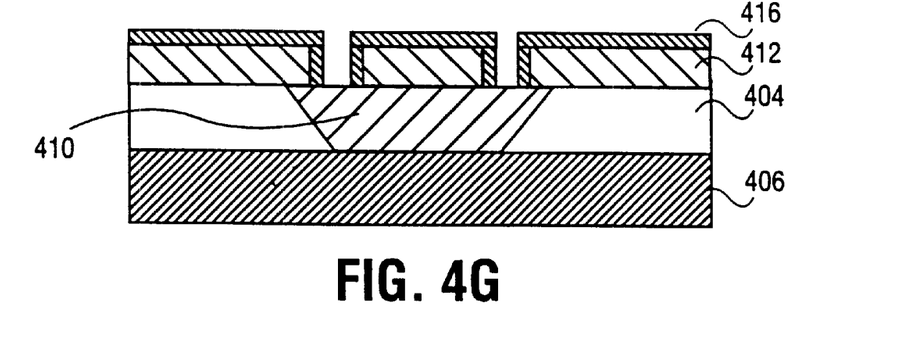

In FIG. 4G, a conductive layer 416 is formed. In one embodiment, the conductive layer 416 may be a wiring layer, such as an aluminum layer formed by vapor deposition, for example, by sputtering aluminum. It will be appreciated that other conductive materials may also be used, for example, conductive polymers, metals (e.g., copper, silver, gold, chromium, etc.), metal alloys, metal particles, conductive organic compounds, or conductive oxides.

Further, it will be appreciated that other methods of forming the conductive layer 416 may be used. In one embodiment, the conductive layer 416 may be formed by vapor deposition of more than one metal, for example, a deposition of 100 angstroms chromium and 1500 Å copper in a single pass machine. In other embodiments, the vapor deposition may be accomplished in a multi-pass machine.

Figure 4H:
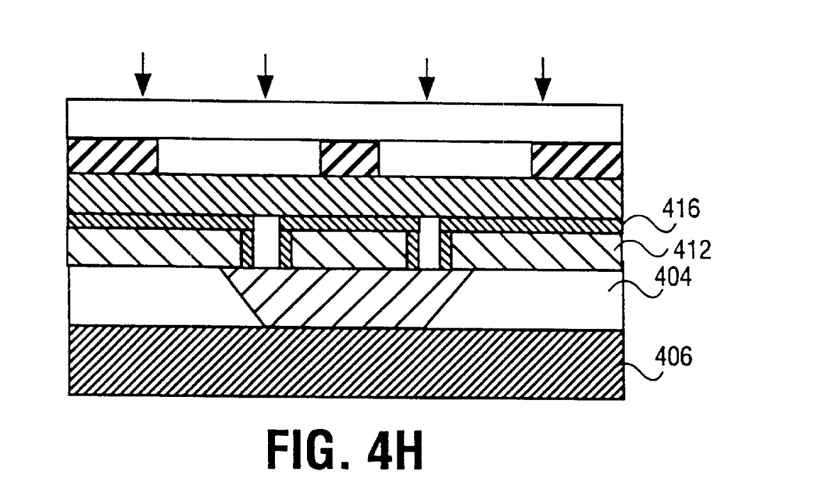

In FIG. 4H, the conductive layer 416 is coated with a photoresist layer, patterned, exposed and developed for the formation of protective layers over the interconnect vias 414.

Figure 4I:
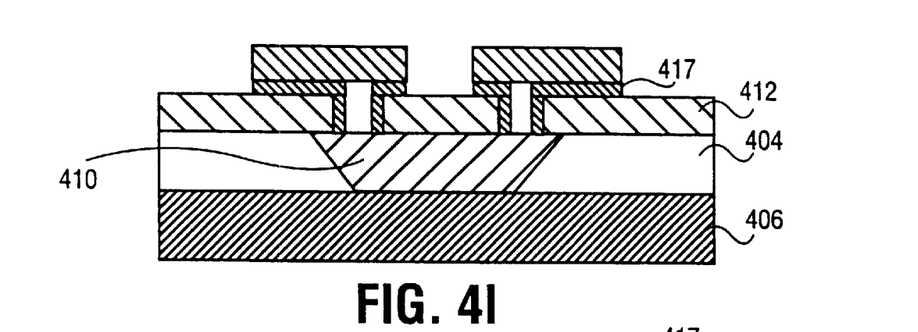

In FIG. 4I, the exposed conductive layer 416 is etched forming conductive interconnects 417, e.g., wiring, to the functional component 410.

Figure 4J:
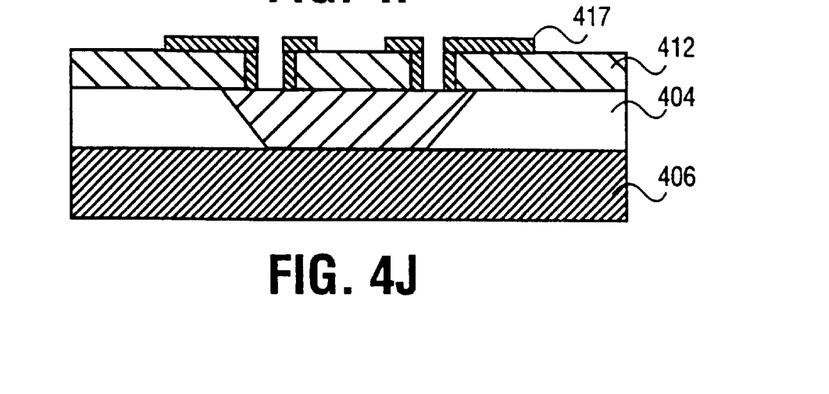

In FIG. 4J, the protective layer is removed leaving the conductive interconnects 417. It should be noted that the conductive interconnects 417 extend outside the footprint of the functional component 410.

In one embodiment, the interconnects 417 may be further built up by electroplating another layer of conductive material onto the interconnects 417. For example, in one embodiment, the interconnects 417 may be further built up by electroplating on a copper layer have a thickness in the range between and including 10–15 microns. It will be appreciated that other conductive materials may be used in electroplating up the interconnects 417.

Figure 4K:
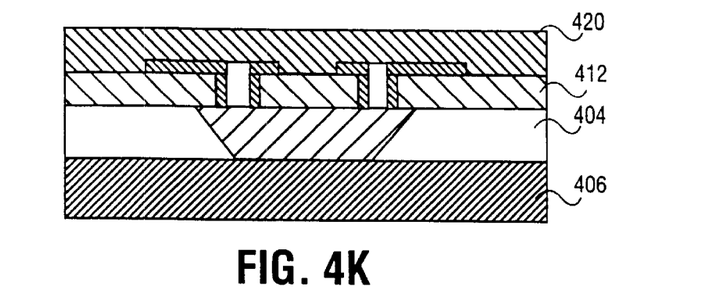

In FIG. 4K, a second dielectric layer 420 such as $SiO_2$ is formed 417, i.e., above the interconnects 417 and exposed top of the substrate 402.

Figure 4L:
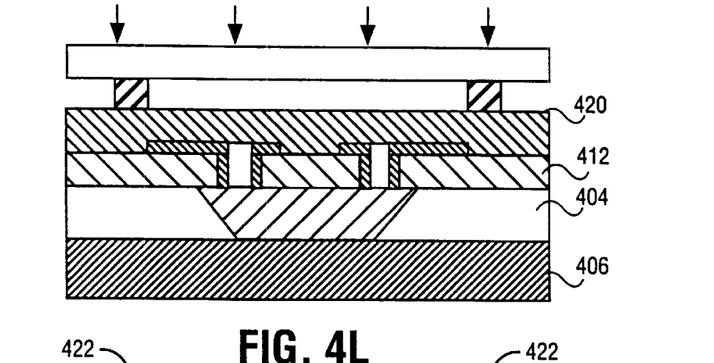

In FIG. 4L, the second dielectric layer 420 is then patterned and exposed for the formation of openings.

Figure 4M:
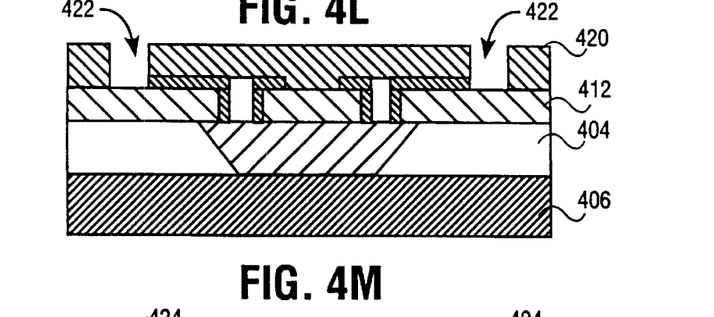

In FIG. 4M, the pattern is developed to form openings 422 for receiving conductive elements.

Figure 4N:
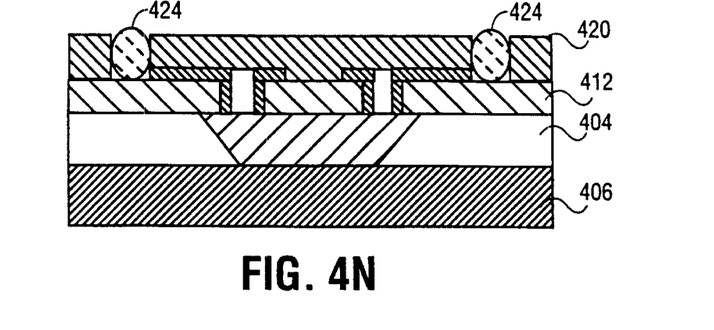

In FIG. 4N, conductive elements 424 are deposited into the openings 422. In one embodiment, the conductive elements 424 may be solder balls deposited by a pick and place method. It will be appreciated that other conductive elements may also be utilized, such as gold puffs, springs, etc.

In FIG. 4O, the conductive elements 424 may be reflowed establishing a conductive interconnection through the conductive interconnects 417 to the functional components 410.

As earlier discussed with reference to FIG. 3, the integrated circuit packages may then be singulated, i.e., for example, cut and excised from the main body of the substrate.

Figure 5:
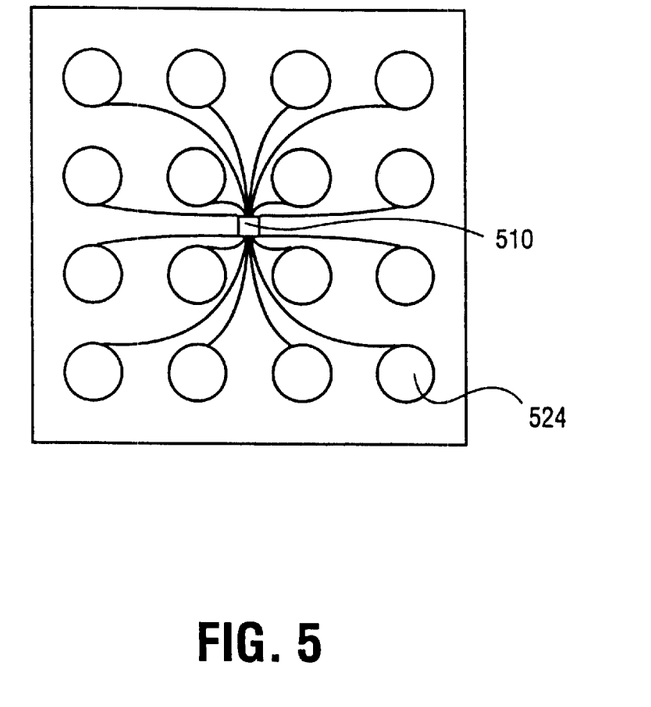
FIG. 5 shows a generalized top view of one embodiment of a 16 input/output integrated circuit package formed according to the present invention that illustrates the fan-out pattern of the conductive elements from the integrated circuit.

FIG. 5 shows a generalized top view of one embodiment of a 16 input/output integrated circuit package formed according to the present invention that illustrates the fan-out pattern of the conductive elements from the integrated circuit. By fabricating the integrated circuit package as described above with reference to FIGS. 3 and 4A–4O, the resultant integrated circuit package has a fan-out pattern rather than a fan-in pattern as seen in the prior art example illustrated at FIG. 2. In a fan-out pattern the conductive elements 524, for example, the solder balls, are peripheral to the functional component 510. This fan-out design allows for some design independence from the ever-decreasing size of the integrated circuit component. In the fan-out design of the present invention, the integrated circuit may decrease in size and have finer interconnection patterns independent of the size of the conductive elements as the conductive elements reside outside the integrated circuit.

Alternate Embodiments for Planarization

Figure 6:
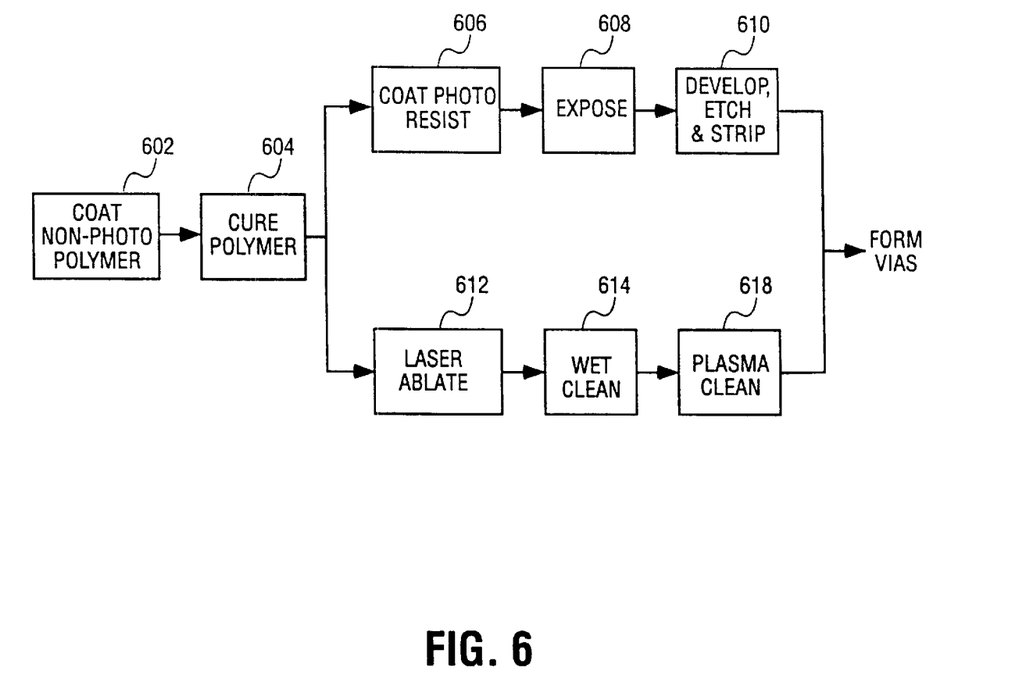
FIG. 6 illustrates alternate embodiments of planarization that may be used in forming integrated circuit packages according to the present invention.

FIG. 6 illustrates alternate embodiments of planarization that may be used in forming integrated circuit packages according to the present invention.

At block 602, the substrate with assembled functional components may be coated with a non-photo polymer.

At block 604, the polymer is cured.

After curing, at block 606, the polymer may be coated with a photoresist.

At block 608, the photoresist is exposed.

At block 610, the photo resist is developed, etched and stripped forming the interconnect vias in preparation for formation of the conductive interconnects.

Alternatively, after curing the polymer at block 604, at block 612, the polymer may be laser ablated.

At block 614, the surface may be wet cleaned.

At block 618, the surface may then be plasma cleaned stripped forming the interconnect vias in preparation for formation of the conductive interconnects.

Example

Figure 7:
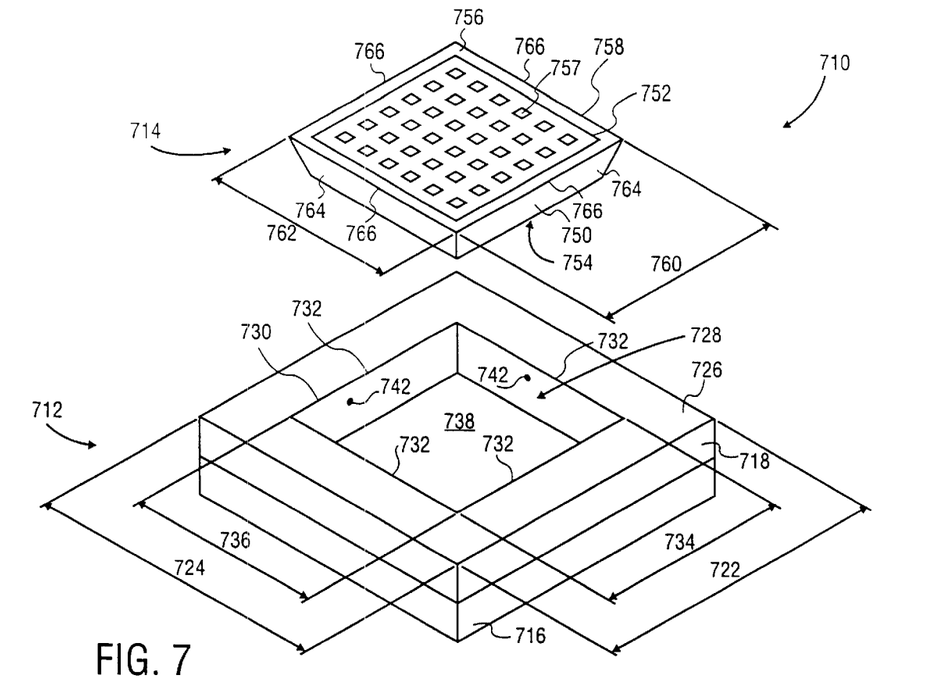
FIG. 7 is a perspective view of an integrated circuit package according to the invention, including a package substrate and a semiconductor die.
Figure 8:
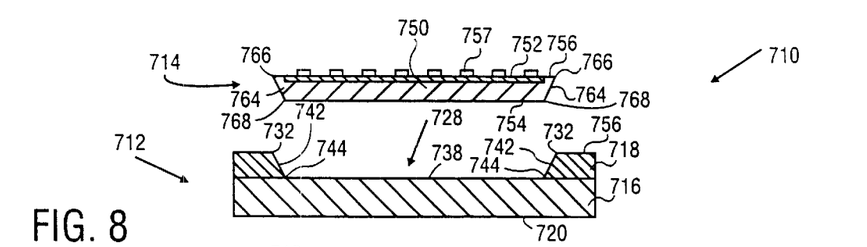
FIG. 8 is a cross-sectional side view illustrating the components of FIG. 7.
Figure 9:
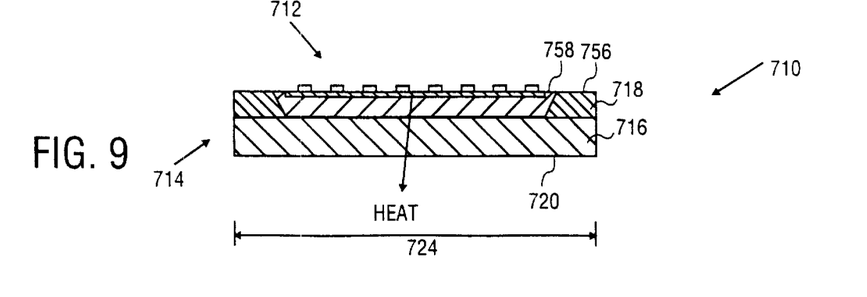
FIG. 9 is a view similar to FIG. 8 after the die is dropped in the opening in the substrate.

FIGS. 7, 8 and 9 now illustrate an integrated circuit package 710 which is manufactured according to the method hereinbefore described. The semiconductor package 710 includes a package substrate 712 and an integrated circuit die 714.

The substrate 712 includes two layers, the first being an aluminum metal layer 716 and the second being a dielectric layer 718 which is formed on the aluminum layer 716. The aluminum layer 716 forms a lower surface 720 of the substrate 712. The dielectric layer 718 is formed directly on the aluminum layer 716. An upper surface 726 of the dielectric layer 718 forms an upper surface of the substrate 712.

An opening 728 is formed in the dielectric layer 726. The opening 728 has a periphery 730 in the upper surface 726. The periphery 730 has four straight edges 732. In another embodiment, the shape of the periphery 730 may be different. The periphery 730 has a width 734 and a length 736.

A lower surface 738 of the opening 728 is formed by the metal layer 716. The metal layer 716 is continuous from the lower surface 738 of the opening 728 to the lower surface 720 of the substrate 712. In another embodiment a metal layer may be deposited in the opening 728.

The opening 728 has four sides 742. Each side 742 extends from a respective edge 732 to a respective edge 744 of a periphery of the lower surface 738. The respective side 742 extends from the respective edge 732 towards the respective edge 744 downwardly and away from the edge 732. As such, opposing sides 742 extend downwardly and towards one another. Extensions of opposing sides 742 will meet at a point below the lower surface 738. As such, the opening 728 has an inverted frustum-pyramydal shape having a square base. In another embodiment the shape of the opening 728 may be different.

The die 714 includes a semiconductor substrate 750, typically made of silicon, and an integrated circuit 752 formed on an upper surface of the substrate 750. A lower surface 754 of the substrate 750 forms a lower surface of the die 714. The integrated circuit 752 is formed at or near an upper surface 757 of the die 714. A plurality of bond pads 757 are formed on the upper surface 756. Each bond pad 757 is connected to the integrated circuit 752. Electronic signals can be transferred through the bond pad 757 to and from the integrated circuit 752.

The surface 756 is substantially flat and has a periphery 758. The periphery 758 had a width 760 and a length 762. The width 760 is substantially the same as the width 734 and substantially more than the width 722. The length 762 is substantially the same as the length 736 and substantially more than the length 724. The periphery 758 is substantially square and has a shape which is complementary to the shape of the periphery 730.

The die 714 has four sides 764. Each side 764 extends from a respective edge 766 to respective edge 768 of a periphery of the lower surface 754. A respective side 764 extends at an angle with respect to vertical so that the side 764 extends from the periphery 766 downwardly and under the surface 756 towards the edge 768. Opposing ones of the sides 768 thus extend downwardly and towards one another. Extensions of the sides 764 will meet at a point below the surface 754. As such, the die 714 has an inverted frustum-pyramydal shape with a square base. The shape of the opening 728 is in all respects substantially complementary to the shape of the die 714. When the die 714 falls into the opening 728, as shown in FIG. 9, the lower surface 754 is located against the lower surface 738 and the sides 764 contact the sides 742. The upper surface 756 is then substantially flush with the upper surface 726. The semiconductor package is thereafter finally manufactured as shown in FIG. 4N.

In use, electric signals are transferred through the bond pads 757 to and from the integrated circuit 752, causing the integrated circuit 752 to heat up. Heat is transferred from the integrated circuit 752 through the semiconductor substrate 750 to the lower surface 754 thereof. The heat then transfers from the lower surface 754 to the lower surface 738 of the opening 728. The heat is then absorbed into the metal layer 716 forming the lower surface 738 and is conducted downwardly through the metal layer 716 without obstruction from any non-metal components. The heat transfers to the lower surface 720 of the metal layer 716, from where the heat can be conducted away from the lower surface 720 and away from the semiconductor package 710.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

I claim:

1. An integrated circuit package comprising:
    a substrate, said substrate having a top first dielectric layer, said substrate having at least one recessed receptor region for receiving an integrated circuit;
    at least one integrated circuit deposited in said receptor region, said integrated circuit having a wired side, said integrated circuit being deposited into said receptor region by fluidic self-assembly such that said wired side is facing outward from said receptor region;
    a conductive layer on said first dielectric layer, said conductive layer forming conductive interconnects to said integrated circuit;
    a second dielectric layer on said conductive layer, said second dielectric layer having openings for receiving conductive elements;
    conductive elements, said conductive elements being deposited in said openings so that said conductive elements are in contact with said conductive layer, said conductive elements being attached in said openings.

2. The integrated circuit package of claim 1 wherein said conductive interconnects are electroplated.

3. The integrated circuit package of claim 1 wherein said substrate further comprises a thermally conductive layer.

4. The integrated circuit package of claim 3 wherein said receptor region is recessed through said first dielectric layer exposing said thermally conductive layer, and wherein said wired side of said integrated circuit is facing outward from said receptor region and the non-wired side of said integrated circuit is in contact with said thermally conductive layer.

5. The integrated circuit package of claim 1 wherein said functional components are keyed to be received by said receptor regions so that said wired side of said functional component is facing outward from said receptor region.

6. The integrated circuit package of claim 1 wherein said functional components are shaped nanoblocks.

7. The integrated circuit package of claim 1 wherein said integrated circuit is keyed to be received in said receptor region in at least one pre-determined orientation.

8. The integrated circuit package of claim 1 wherein said openings are outside the footprint of the integrated circuit.

9. The integrated circuit package of claim 1 wherein said conductive elements are solder balls.

10. The integrated circuit package of claim 9 wherein said conductive elements are attached by reflowing.

11. An integrated circuit package comprising:
    a semiconductor substrate;
    an integrated circuit formed on an upper surface of the semiconductor substrate to form an integrated circuit die having an upper surface and sides extending from a periphery of the upper surface, opposing ones of the sides extending downward and towards one another so that the sides are located below the upper surface;
    a plurality of pads formed on the upper surface of the die and being electrically connected to the integrated circuit; and
    a package substrate having upper and lower surfaces, an opening being formed in the upper surface, the opening having sides, opposing ones of the sides extending downward from a periphery of the opening, the substrate having a thickness below the opening and a portion of the thickness being metal, the die being located in the opening with the opposing sides thereof adjacent the opposing sides of the opening and the die being sufficiently close and thermally connected to the metal for heat to transfer from the die to the metal and from the metal away from the substrate.

12. The integrated circuit package of claim 11 wherein the metal forms the opposing sides of the opening in the package substrate extend downwardly and towards one another.

13. The integrated circuit package of claim 11 wherein the die contacts the metal.

14. The integrated circuit package of claim 11 wherein the die has a lower surface which is smaller than the upper surface and the sides thereof extend from the periphery of the upper surface to a periphery of the lower surface.

15. The integrated circuit package of claim 14 wherein the opening has a lower surface which is smaller than the upper surface and the sides thereof extend from the periphery of the upper surface to a periphery of the lower surface.

16. The integrated circuit package of claim 15 wherein the lower surface of the die contacts the lower surface of the opening.

17. The integrated circuit package of claim 16 wherein the metal forms the lower surface of the opening.

18. The integrated circuit package of claim 17 wherein the metal is continuous from the lower surface of the opening to the lower surface of the substrate.

19. The integrated circuit package of claim 11 wherein the metal is aluminum.

20. The integrated circuit package of claim 11 wherein the periphery of the opening has a shape which is complementary to a shape of the periphery of the upper surface of the die.

21. The integrated circuit package of claim 11 wherein the upper surface of the die is substantially flush with the upper surface of the substrate.

22. The integrated circuit package of claim 11 further comprising:
    a plurality of contacts secured to the upper surface of the substrate; and
    a plurality of interconnection lines, each interconnection line interconnecting a respective one of the bond pads with a respective one of the contacts.

23. The integrated circuit package of claim 22 wherein the contacts are located outside the periphery of the opening.

24. The integrated circuit package of claim 22 further comprising:
    a dielectric layer formed over the upper surface of the substrate, the interconnection lines being formed on the dielectric layer.

* * * * *